(12) United States Patent
Ventola et al.

(10) Patent No.: US 8,817,858 B2
(45) Date of Patent: Aug. 26, 2014

(54) DATA PROCESSING

(71) Applicant: Broadcom Corporation, Irvine, CA (US)

(72) Inventors: Mika Eljas Ventola, Oulu (FI); Janne Ari Olavi Aula, Haukipudas (FI)

(73) Assignee: Broadcom Corporation, Irvine, CA (US)

( * ) Notice: Subject to any disclaimer, the term of this patent is extended or adjusted under 35 U.S.C. 154(b) by 97 days.

(21) Appl. No.: 13/676,739

(22) Filed: Nov. 14, 2012

(65) Prior Publication Data
US 2013/0251011 A1 Sep. 26, 2013

(30) Foreign Application Priority Data

Mar. 21, 2012 (GB) .................... 1204972.2
Sep. 18, 2012 (GB) .................... 1216646.8

(51) Int. Cl.
*H04W 4/00* (2009.01)
(52) U.S. Cl.
USPC .......................................... 375/222
(58) Field of Classification Search
CPC ............ G06F 17/14; G06K 9/00; H04B 1/10; H04B 1/38; H04B 17/00; H04J 3/06; H04K 1/10; H04L 25/02; H04L 25/0206; H04L 27/00; H04L 27/06; H04W 4/00; H04W 24/00; H04W 88/02
USPC .......... 370/328, 329, 350; 375/219, 222, 240, 375/242, 240.17, 240.2, 240.26, 260, 316, 375/343, 347; 382/100, 244, 250, 277, 294, 382/300; 455/424; 709/246, 247; 714/746–751; 708/404
See application file for complete search history.

(56) References Cited

U.S. PATENT DOCUMENTS

| 6,678,423 | B1 | 1/2004 | Trenary et al. |
| 2002/0107987 | A1 | 8/2002 | Malm |
| 2003/0012299 | A1* | 1/2003 | Kuchi et al. ................. 375/299 |
| 2003/0095685 | A1* | 5/2003 | Tewfik et al. ................. 382/100 |
| 2004/0219883 | A1* | 11/2004 | Pauli et al. ................. 455/67.11 |

(Continued)

FOREIGN PATENT DOCUMENTS

EP 1 821 256 A1 8/2007

OTHER PUBLICATIONS

UKIPO Combined Search and Examination Report under Section 17 and 18(3) dated Aug. 13, 2012 which is issued in a related British Application No. GB1204972.2 (6 pages).

(Continued)

*Primary Examiner* — Sam K Ahn
*Assistant Examiner* — Shawkat M Ali
(74) *Attorney, Agent, or Firm* — Foley & Lardner LLP; Christopher J. McKenna; Daniel E. Rose

(57) ABSTRACT

Measures for use in processing data in a user equipment radio receiver, the radio receiver comprising a modem adapted for wireless communication with a telecommunications network. Data associated with wireless communication conducted via the modem is received, the received data being defined in a first domain. The received data is transformed from the first domain into a second domain using a transform function to generate transformed data in the second domain. The transformed data is compressed in the second domain to produce compressed data in the second domain. The compressed data is stored in memory in the user equipment radio receiver.

39 Claims, 6 Drawing Sheets

(56) References Cited

U.S. PATENT DOCUMENTS

| | | |
|---|---|---|
| 2007/0195988 A1* | 8/2007 | Kogure et al. ................. 382/100 |
| 2010/0005356 A1 | 1/2010 | Cho et al. |
| 2010/0128818 A1* | 5/2010 | Shepherd et al. ............. 375/316 |
| 2012/0033587 A1* | 2/2012 | Papasakellariou et al. ... 370/277 |
| 2012/0177092 A1* | 7/2012 | Zirwas .......................... 375/219 |

OTHER PUBLICATIONS

UKIPO Search Report under Section 17 dated Nov. 14, 2012 which is issued in a related British Application No. GB1216646.8 (4 pages).

* cited by examiner

| | Base | Required | w/compression |
|---|---|---|---|
| | 355768 | 355768 | |
| | 105693 | 105693 | |
| | 28165 | 132100 | |
| | 21346 | 36620 | |
| | 20753 | 32459 | |
| | 14824 | 14824 | |
| | 546549 | 677465 | 677465 |
| | 0 | 997304 | 668194 |
| | 0 | 997304 | 668194 |
| | 32316 | 32316 | |
| | 30537 | 45324 | 30367 |
| | 71154 | 136808 | 91661 |
| | 38542 | 118647 | 79493 |
| | 4151 | 4151 | |
| | 14824 | 14824 | |
| | 191522 | 352068 | 252811 |
| | 77083 | 125328 | |
| | 8301 | 18240 | |
| | 117107 | 352068 | 207909 |
| | 23421 | 96089 | |
| | 14824 | 14824 | |
| | 240737 | 565792 | 463189 |
| | 878807 | 2592829 | 2061859 |
| | 235400 | 1052255 | |
| | 235400 | 1052255 | 1052255 |
| | 29647 | 952154 | |
| | 0 | 2804336 | 187905 |
| | 29647 | 3756489 | 2831059 | Area w compression of total memory = 0.80 |
| | 1243855 | 7401374 | 5245173 | |
| | | | | Area w compression of total area (mem + logic) = 0.83 |
| | 602 | | 600 | |

FIG. 6

DATA PROCESSING

CROSS REFERENCE TO RELATED APPLICATION

This application claims the benefit of foreign priority under 35 U.S.C. §119(a) and 37 CFR §1.55 to UK Patent Application No. 1204972.2, filed on Mar. 21, 2012 and to UK Patent Application No. 1216646.8, filed on Sep. 18, 2012, the entire content of each of which is incorporated herein by reference.

TECHNICAL FIELD

The present disclosure relates to processing data in a user equipment radio receiver, the radio receiver being adapted for wireless communication with a telecommunications network.

BACKGROUND INFORMATION

In current HSPA and LTE modems the size of memory compared to the processing logic of L1 HW accelerators is roughly 1:1.5 ('1 to 1.5'). As data rates increase in future, the size of memory will increase correspondingly, whilst the L1 HW may often be used (almost) as it is by increasing the clock rate of the processing logic. For example, in LTE-A, more carriers (for example 2-4 carriers) will be aggregated to the system and the size of the memory will increase correspondingly. However, it is possible to increase the clock frequency of the processing logic and thus time-share the existing HW accelerators and thus support LTE-A with minimum changes to the processing logic.

Optimizing the processing logic is possible but requires time and resources and typically provides only marginal gains. However, if the memory requirements can be lowered, significant chip area savings may be obtained with relatively small effort compared to processing logic optimization.

A paper by Wolfgang Rave, published in IEEE Signal Processing Letters, April 2009, entitled "Quantization of Log-Likelihood Ratios to Maximize Mutual Information" describes compression of Log-Likelihood Ratios.

A paper by Matteo Danieli et al, published in the 2010 IEEE Data Compression Conference, entitled "Maximum Mutual Information Vector Quantization of Log-Likelihood Ratios for Memory Efficient HARQ Implementations" describes the compression of HARQ data using Log-Likelihood Ratios.

It would therefore be desirable to provide improved ways of reducing memory requirements in modems.

SUMMARY in accordance with first embodiments, there is apparatus for use in processing data in a user equipment radio receiver, the radio receiver comprising a modem adapted for wireless communication with a telecommunications network, the apparatus comprising at least one processor, and at least one memory including computer program code, the at least one memory and the computer program code being configured to, with the at least one processor, cause the apparatus at least to:

receive, via the modem, first data associated with wireless communication conducted via the modem, the first data being defined in a first domain;

transform the first data from the first domain into a second domain using a transform function to generate first transformed data in the second domain;

compress the first transformed data in the second domain to produce first compressed data in the second domain; and store, in memory in the radio receiver, the compressed data.

In accordance with second embodiments, there is a method of processing data in a user equipment radio receiver, the receiver comprising a modem adapted for wireless communication with a telecommunications network, the method comprising:

receiving, via the modem, first data associated with wireless communication conducted via the modem, the first data being defined in a first domain;

transforming the first data from the first domain into a second domain using a transform function to generate first transformed data in the second domain;

compressing the first transformed data in the second domain to produce first compressed data in the second domain; and storing, in memory in the radio receiver, the compressed data.

Embodiments comprise computer software for use in processing data in a user equipment radio receiver, the radio receiver comprising a modem adapted for wireless communication with a telecommunications network, the computer software being adapted to:

receive, via the modem, first data associated with wireless communication conducted via the modem, the first data being defined in a first domain;

transform the first data from the first domain into a second domain using a transform function to generate first transformed data in the second domain;

compress the first transformed data in the second domain to produce first compressed data in the second domain;

store, in memory in the radio receiver, the combined data.

In accordance with third embodiments, there is a computer program product comprising a non-transitory computer-readable storage medium having computer readable instructions stored thereon, the computer readable instructions being executable by a computerized device to cause the computerized device to perform a method of processing data in a user equipment radio receiver according to the second embodiments.

In accordance with fourth embodiments, there is provided apparatus according to the first embodiments, wherein the apparatus comprises one or more of a chipset, a radio receiver, and a user equipment.

Further features and advantages will become apparent from the following description of preferred embodiments, given by way of example only, which is made with reference to the accompanying drawings.

BRIEF DESCRIPTION OF THE DRAWINGS

FIG. 6 shows a table according to embodiments.

DETAILED DESCRIPTION

Figure 1:
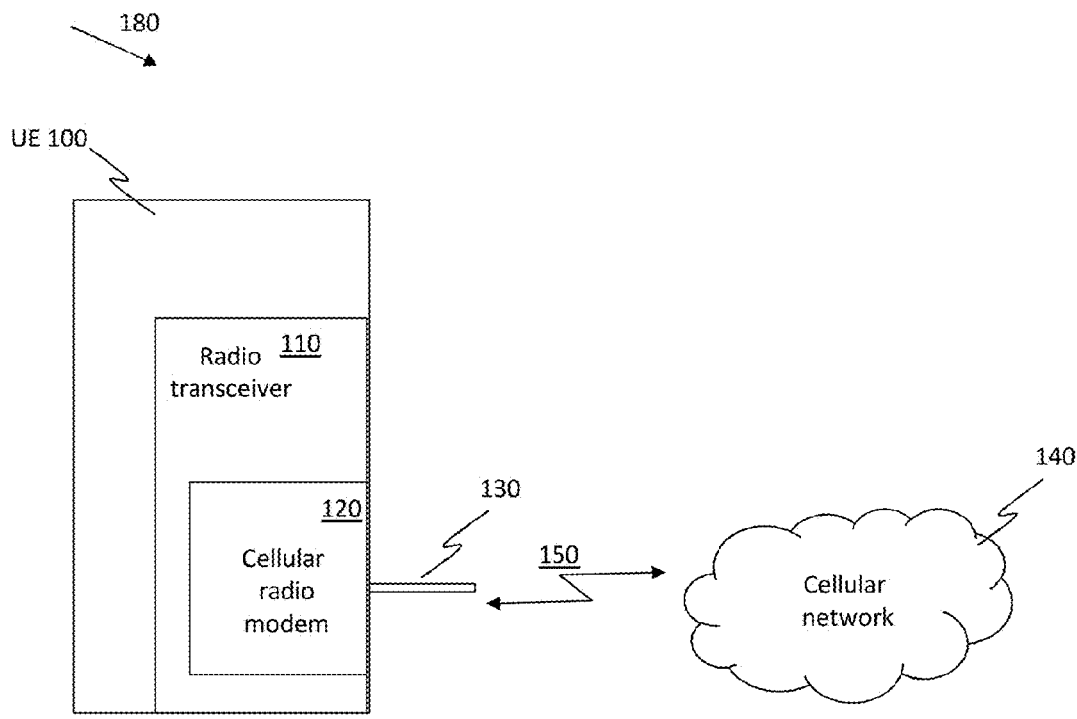
FIG. 1 shows a telecommunications network according to embodiments.

FIG. 1 shows a telecommunications network 180 according to embodiments.

Telecommunications network 180 comprises a cellular network part 140 such as a GSM, W-CDMA, or LTE/LTE-A network or part thereof. A UE 100 comprises a radio receiver 110 which includes a cellular radio modem 120 with antenna 130. Cellular radio modem 120 is adapted for wireless (or 'OTA') communication across a radio link 150 with cellular network part 140 of telecommunications network 180.

UE 100 also includes various other components (not shown) for providing non-communication related functionality, for example one or more user interface components. Similarly, cellular network part 140 of telecommunications network 180 will include various other network entity components (not shown) such as base stations, node Bs, evolved node Bs, network control entities such as radio network controllers, etc. whose operation is known in the art. Cellular network 140 part of telecommunications network 180 will interconnect with one or more other networks (not shown) such as PSTNs, the Internet, and one or more other cellular networks.

Figure 2:
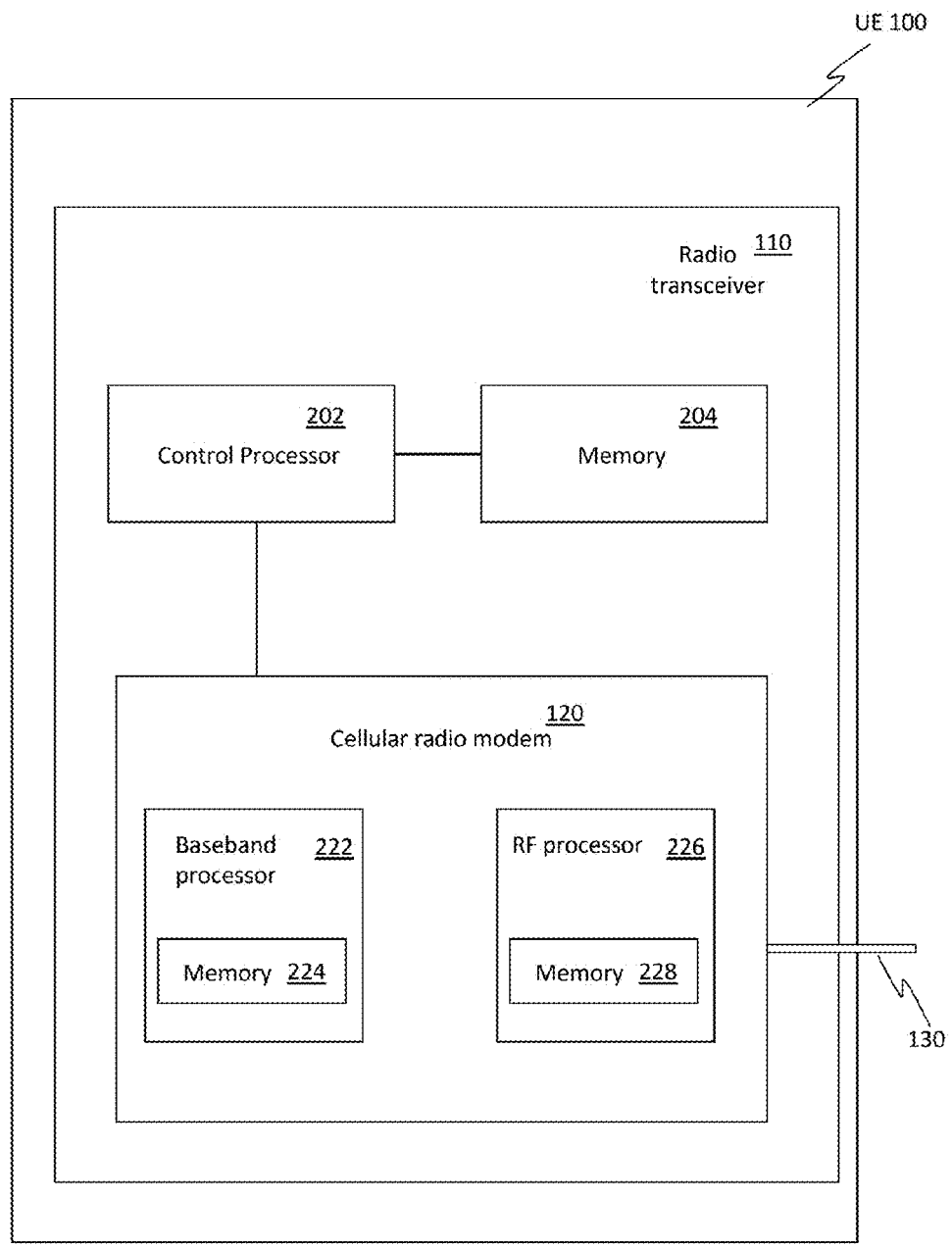
FIG. 2 shows a user equipment according to embodiments.

FIG. 2 shows UE 100 depicted in FIG. 1 in more detail according to embodiments of the invention. Radio transceiver 110 of UE 100 provides radio transmitter and radio receiver functionality. Radio transceiver 110 includes a control processor 202 and memory 204. Radio transceiver 110 also comprises a cellular radio modem 120 which includes a baseband processor 222 for at least providing baseband data processing functionality and an RF processor 226 for providing RF data processing functionality. Baseband processor 222 has internal memory 224, for example for storing modem baseband firmware. RF processor 226 has internal memory 228, for example for storing modem RF firmware. Memory 204 and internal memories 224 and 228 will typically comprise non-volatile memory.

Embodiments involve methods, apparatus, computer software and computer program products for processing data in a user equipment radio receiver, for example a radio receiver part of radio transceiver 110. The user equipment radio receiver comprises a modem which is adapted for wireless communication with telecommunications network 180. In the embodiments depicted in FIG. 2, the modem comprises a cellular radio modem 120 adapted for wireless communication with cellular part 140 of telecommunications network 180. In alternative embodiments, the modem comprises a non-cellular radio modem (not shown) adapted for wireless communication with a non-cellular part (not shown) of telecommunications network 180.

In embodiments, baseband processor 222 carries out the main data processing tasks of embodiments as described below.

Figure 3:
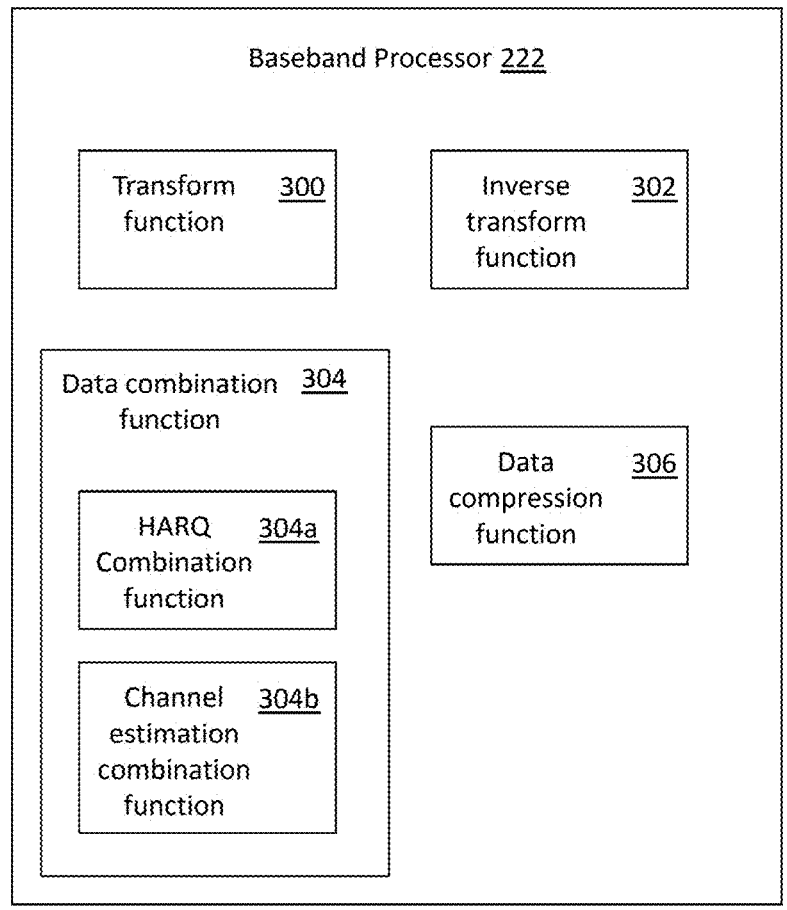
FIG. 3 shows a control processor according to embodiments.

FIG. 3 shows baseband processor 222 depicted in FIG. 2 in more detail according to embodiments. Baseband processor 222 comprises a transform function 300 for transforming data received via cellular radio modem 120 from one domain to another, for example from a time domain to a frequency domain or vice versa. Baseband processor 222 comprises an inverse transform function 302 for transforming data from one domain to another, for example from a frequency domain to a time domain or vice versa. Baseband processor 222 comprises a data compression function 306 for compressing data which has been transformed from the first domain into the second domain by transform function 300. Baseband processor 222 comprises a data combination function 304 for combining data in the second domain which has been compressed by data compression function 306 with other data in the second domain which has been compressed by data compression function 306.

In embodiments, transform function 300 and inverse transform function 302 are linear functions. Passing a set of data via transform function 300 and then subsequently via inverse transform function 302 will result in the original data set being produced.

In embodiments, data combination function 304 comprises a HARQ (Hybrid Automatic Repeat reQuest) combination function 304a for combining HARQ transmission data with HARQ re-transmission data. In embodiments, data combination function 304 comprises a channel estimation combination function 304b such as a channel estimate data averaging function.

Figure 4:
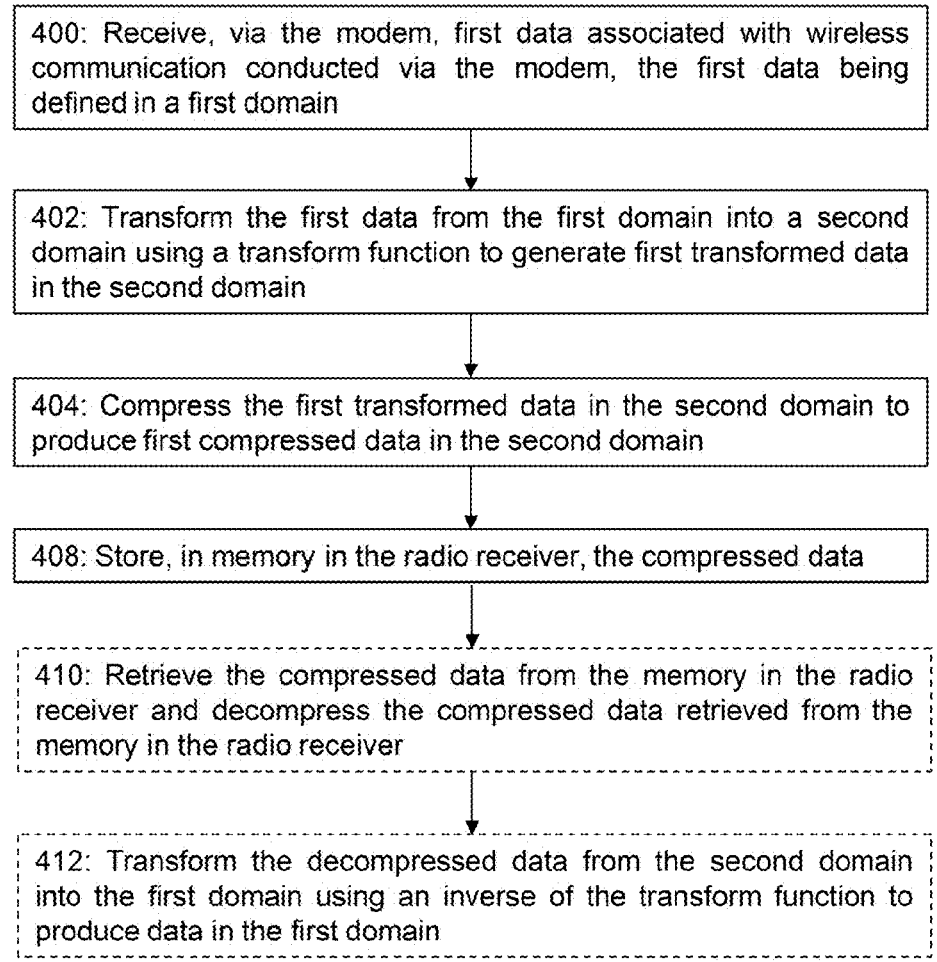
FIG. 4 shows a flow diagram according to embodiments.

FIG. 4 shows a flow diagram according to embodiments. Steps 410 and 412 are optional and are thus depicted as dashed lines.

As shown in step 400 of FIG. 4, first data associated with wireless communication conducted via modem 120 is received via modem 120. The first data is defined in a first domain, for example a time domain. Receipt of data via modem 120 may involve conversion of one or more analogue signals to digital samples.

The first data is passed to baseband processor 222 for processing.

As shown in step 402 of FIG. 4, transform function 300 of baseband processor 222 transforms the first data from the first domain into a second domain using a transform function to generate first transformed data in the second domain.

In embodiments, the transform function comprises a Discrete Fourier Transform (DFT) and the second domain comprises a frequency domain.

In embodiments, the transform function comprises a Discrete Cosine Transform (DCT) and the second domain comprises a cosine function domain.

In embodiments, the transform function comprises a Walsh Hadamard Transform (WHT) and the second domain comprises a Walsh function domain.

In embodiments, the transform function is based at least in part on a DFT, DCT or a WHT.

The transform to be used may be decided based on the properties of the data to be compressed so that the compression ratio compared to the implementation complexity and the error due to the lossy compression is optimal.

As shown in step 404 of FIG. 4, data compression function 306 of baseband processor 222 compresses the first transformed data in the second domain to produce first compressed data in the second domain.

As shown in step 408 of FIG. 4, baseband processor 222 stores, in memory 224 of the radio receiver, the compressed data.

In embodiments, baseband processor 222 retrieves the compressed data from memory 224 of the radio receiver and decompresses the compressed data retrieved from memory 224, as shown by step 410 of FIG. 4, and transforms the decompressed data from the second domain into the first domain using an inverse of the transform function to produce data in the first domain, as shown by step 412 of FIG. 4.

The decompression may be carried out by data compression function 306 or a separate data decompression function (not shown).

In alternative embodiments, the combined, compressed data is stored in memory 204 of control processor 202 and/or internal memory 228 of RF processor 226.

Figure 5:
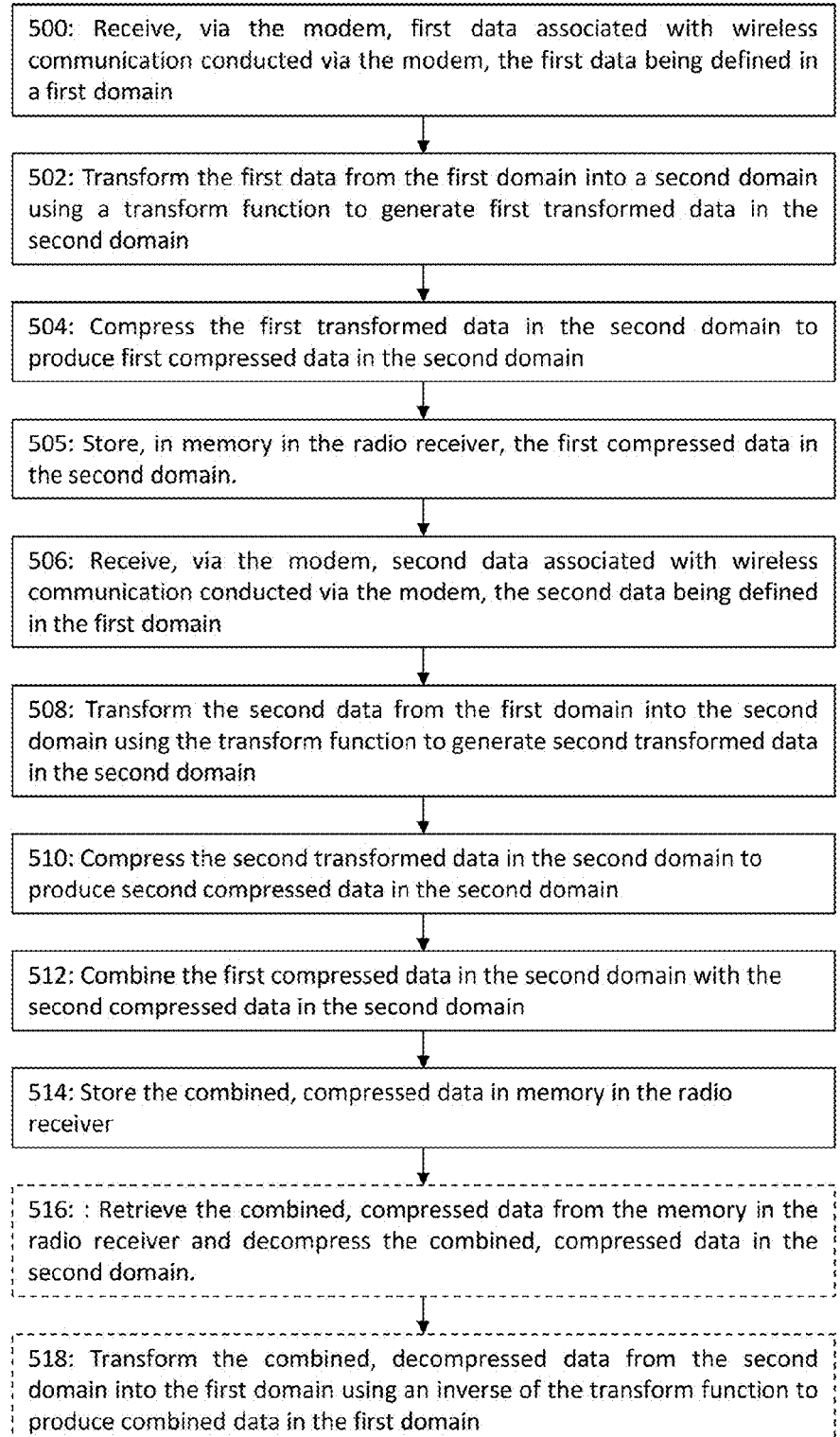
FIG. 5 shows a flow diagram according to embodiments.

FIG. 5 shows a flow diagram according to embodiments. Steps 516 and 518 are optional and are thus depicted as dashed lines.

As shown in step 500 of FIG. 5, first data associated with wireless communication conducted via modem 120 is received via modem 120. The first data is defined in a first domain, for example a time domain. As one example, the first data could comprise HARQ transmission data which is associated with wireless communication conducted via modem 120, e.g. on radio link 150. As another example, the first data could comprise first channel estimate data which is associated with wireless communication conducted via modem 120, e.g. on radio link 150.

As shown in step 502 of FIG. 5, transform function 300 of baseband processor 222 transforms the first data from the first domain into a second domain using a transform function to generate first transformed data in the second domain. The second domain may for example comprise a frequency domain. The transform function may for example comprise a Discrete Fourier Transform (DFT) or a Discrete Cosine Transform (DCT) or be based at least in part on a DFT or a DCT.

As shown in step 504 of FIG. 5, data compression function 306 of baseband processor 222 compresses the first transformed data in the second domain to produce first compressed data in the second domain.

As shown in step 505 of FIG. 5, baseband processor 222 stores in memory 224 of the radio receiver, the first compressed data in the second domain.

As shown in step 506 of FIG. 5, second data associated with wireless communication conducted via modem 120 is received via modem 120. The second data is also defined in the first domain. As one example, the second data could comprise HARQ re-transmission data which is associated with wireless communication via modem 120, e.g. on radio link 150; here the HARQ re-transmission data comprises re-transmission data which is associated with the first HARQ transmission data. As another example, the second data could comprise second channel estimate data which is associated with wireless communication via modem 120, e.g. on radio link 150; here the second channel estimate data comprises a further (or updated) estimate for the channel estimated by the first channel estimate data.

As shown in step 508 of FIG. 5, transform function 300 of baseband processor 222 transforms the second data from the first domain into the second domain using the transform function to generate second transformed data in the second domain. In embodiments, the transform function applied to the first data is the same as the transform function applied to the second data.

As shown in step 510 of FIG. 5, data compression function 306 of baseband processor 222 compresses the second transformed data in the second domain to produce second compressed data in the second domain.

As shown in step 512 of FIG. 5, data combination function 304 of baseband processor 222 combines the first compressed data in the second domain with the second compressed data in the second domain.

As shown in step 514 of FIG. 5, baseband processor 222 stores the combined, compressed data in memory 224 of the radio receiver.

In further alternative embodiments, the combined, compressed data is stored in memory 204 of control processor 202 and/or internal memory 228 of RF processor 226.

In embodiments, combination step 512 and storing step 514 occur "in place" in memory in the radio receiver, i.e. the second data in the second domain is combined with the first data in the second domain directly to a memory area of the first data in the second domain.

In some embodiments, the first data comprises HARQ transmission data associated with wireless communication conducted via the modem, the second data comprises HARQ re-transmission data associated with wireless communication conducted via the modem, and the combining comprises a HARQ combining operation. In such embodiments, the combining is carried out by HARQ combination function 304a of baseband processor 222.

In other embodiments, the first data comprises first radio channel estimate data associated with wireless communication conducted via the modem, the second data comprises second radio channel estimate data associated with wireless communication conducted via the modem. In such embodiments, the combining comprises averaging of the first radio channel estimate data and the second radio channel estimate data over time and/or frequency, for example to produce an average estimate of a communication channel to/from modem 120. The channel estimation data could comprise orthogonal frequency-division multiplexing (OFDM) data.

Embodiments comprise baseband processor 222 retrieving the combined, compressed data from the memory 224 of the radio receiver, decompressing the combined, compressed data retrieved from memory 224 of the radio receiver, as shown by step 516 of FIG. 5, and transforming the decompressed, combined data from the second domain back into the first domain using an inverse of the transform function to produce combined data in the first domain, as shown by step 518 of FIG. 5. The decompression may be carried out by data compression function 306 or a separate data decompression function (not shown).

According to embodiments where a linear transform function is employed, HARQ combining can be carried out for the compressed data in the second domain. This means that decompression need only be carried out after the first and second (or more) data sets have been combined in the second domain and the data is required in the first domain for processing.

In a first and second prior art approaches, the compression and decompression are based on the quantization only and the combining of compressed data is not addressed.

Alternatively, a second prior art approach would be simply to compress each of data sets, store them separately, and when the data is required for processing, decompress each of the data sets and combine them.

Compared to the first and second prior art approaches, embodiments of the present disclosure are superior in terms of computational complexity compared to the compression ratio as the applied transform improves the compression and the combining may be carried out in the compressed domain.

In embodiments the compression comprises a lossy compression where some information within the data is discarded or otherwise lost. Such lossy compression could comprise quantizing, discarding and/or scaling operations. In embodiments involving quantisation, the number of bits required to represent the data in the second domain is smaller than the number of bits required to represent the data in the first domain i.e. compression of the data is achieved, albeit with the loss of some information.

Embodiments are now described where the first data in the first domain comprises a first block of data denoted by a first data matrix $V_1$ and the second data in the first domain comprises a second block of data denoted by a second data matrix $V_2$. Both $V_1$ and $V_2$ comprise square matrices. The mathematical notation used here is for explanatory purposes only and implementation of embodiments should not be limited to such notation.

The following steps are applied to the blocks of data ($V_1$, $V_2$). Data may for example comprise OFDM channel estimates which are correlated over two dimensions (e.g. time and frequency). Therefore, in these embodiments, two dimensional transform function and two-dimensional data compression are applied. In this case, the two dimensional transform function comprises a two-dimensional DCT transform.

A matrix D (DCT matrix), having dimensions N*N ('N rows by N columns') is defined to apply a transform function for transforming the data from the first domain to a second domain. Transform function 300 of baseband processor 222 transforms the first data from the first domain into the second domain using a transform function; in this case, the transform function comprises a DCT transform function and the DCT matrix D comprises a number of coefficients ($N^2$) to implement a DCT transform function.

Data in first data matrix $V_1$ having dimensions N*N ('N rows by N columns'), where each value comprises $N_b$ bits is multiplied by a transform function matrix D and its transpose $D^T$ in order to transform a first data $V_1$ to the second domain according to:

$$Y_1 = D * V_1 * D^T$$

where the size of matrix $Y_1$ is N*N. Matrix $Y_1$ is the first data in the second domain.

Different embodiments comprise different ways of compressing the transformed data, for example, different ways of reducing the number of bits required to represent $Y_1$; two example compression embodiments are now given, although others may equally be applied in addition or alternatively.

For example, in some embodiments, a number of the most significant elements of matrix $Y_1$ are stored and other elements discarded, where the number of stored elements is $N_s * N_s < N * N$, the compression ratio being $C_r = (N_s * N_s)/(N*N)$.

For example in other embodiments, the number of stored elements is N*N, but the values of $Y_1$ are re-quantized and/or scaled before storing them in order to reduce the number of bits of used to represent the value of elements of $Y_1$ (i.e. $N_{bq}$). In this case the compression ratio is $C_r = N_{bq}/N_b$. For example, if all values of matrix $Y_1$ were scaled down (i.e. divided) by 2 and the resulting values are rounded to the nearest integers, the number of bits required to present the values would be reduced by one, and the compression ratio would be $C_r = (N_b - 1)/N_b$.

Data compression function 306 of baseband processor 222 compresses the first data in the second domain. The first compressed data in the second domain is denoted by $Y_{1,C}$.

Data in second data matrix $V_2$ (size N*N) is now multiplied by matrix D and its transpose $D^T$ in order to transform the second data $V_2$ to a second domain according to:

$$Y_2 = D * V_2 * D^T$$

where the size of matrix $Y_2$ is N*N. Matrix $Y_2$ is the second data in the second domain. Transform function 300 of baseband processor 222 transforms the second data from the first domain into the second domain using the same (DCT) transform function as used for transforming the first data.

Transformed data matrix $Y_2$ is then compressed in a similar manner to transformed data matrix $Y_1$, for example the number of required bits in $Y_2$ is reduced in a similar way as with $Y_1$. Data compression function 306 of baseband processor 222 compresses the second transformed data in the second domain. The second compressed data in the second domain is denoted by $Y_{2,C}$.

The second compressed data $Y_{2,C}$ is combined with the first compressed data $Y_{1,C}$ in order to produce a combined, compressed data according to $Y_C = Y_{1,C} + Y_{2,C}$. Data combination function 304 of baseband processor 222 combines the first compressed data and the second compressed data in the second domain.

In some embodiments, combined, compressed data matrix $Y_C$ in the second domain is stored in memory of radio receiver 110.

In some embodiments, combined, compressed data matrix $Y_C$ in the second domain is retrieved from the memory and decompressed in order to produce a combined, decompressed data matrix $Y_D$ in the second domain. For example, if all values of matrix $Y_1$ were scaled down (i.e. divided) by 2 and rounded to the nearest integers in the compression step, they are scaled up (i.e. multiplied) by 2 in the decompression step.

In further embodiments, the following steps are applied to the combined, decompressed data matrix $Y_D$ by inverse transform function 302, in this case a two dimensional inverse DCT transform:

The decompressed, combined matrix $Y_D$ is multiplied by matrix D and its transpose $D^T$ in order to produce an approximation $V_{hat}$ of combined data matrices $V = V_1 + V_2$ in first domain according to:

$$V_{hat} = D^T * Y_D * D$$

In such further embodiments, the approximation of combined data matrix $V_{hat}$ in the first domain is stored in memory (e.g. memory 224) of radio receiver 110.

In the embodiments described above, the data is correlated in two dimensions so that two-dimensional DCT transform and data compression is applied. In alternative embodiments, the data is correlated over only one dimension and embodiments may function similarly (with slightly modified and simpler DCT calculations) in performing one dimensional DCT transforms and compression to the data.

Data compression methods based on quantization and/or scaling in a transformed (second) domain are lossy, i.e. some information is lost/discarded during the compression operation. Therefore, design of such systems is a trade-off between the performance and compression ratio. However, by applying a linear transform, good compression ratios may be achieved and combination (e.g. averaging) of data can be carried out in the compressed (second) domain, which reduces the complexity further.

Benefits of employing embodiments described herein can be estimated by utilizing current area estimates of recently implemented wireless transceiver logic. FIG. 6 shows a Table 1 according to embodiments.

Columns 2 and 3 in Table 1 show current logic and memory area estimates based on analysis of wireless transceiver logic. Column 4 of Table 1 shows the corresponding estimates when embodiments described herein are employed. Here the compression is applied only to memories where it adds most value (shown in bold font). Logic and memory estimates in Table 1 are given in area units according to different power domains.

According to experimental simulation and analysis, by employing embodiments described herein, random data can be compressed in a DCT domain with relatively minor errors when a compression ratio of approximately 0.67. The compression ratio in Table 1 is therefore assumed to be 33%. Note that all entries in Table 1 have been divided by 1e6 in the description below to improve readability.

In practice, higher compression ratios may be achieved. For example, LTE channel estimates are correlated over time and frequency and such correlated data may be compressed effectively in a transform domain according to embodiments.

According to Table 1, the final memory area estimate with compression according to embodiments described herein is approximately 5.9 area units (see item 600). This means that approximately 1.5 area units of memory is saved, as compared to without employing embodiments described herein. As the total amount of memory is approximately 7.4 area units, the estimated memory area saving by employing embodiments described herein is approximately 20%.

Furthermore, the total area of logic and memory is 8.6 area units without employing embodiments described herein. Then, assuming that the current logic added to the compressed memory area when employing embodiments described herein is 7.1 area units (i.e. item 600+item 602), this results in approximately a 17% area saving.

Note that the required logic for implementing embodiments described herein was excluded in the analysis. However, it is reasonable to assume that the required additional logic compared to the total area saving is very small.

The above embodiments are to be understood as illustrative examples. Further embodiments are envisaged.

In embodiments described above, baseband processor 222 carries out the main data processing tasks of embodiments. In alternative embodiments, one or more of such data processing tasks are carried out by control processor 202. In further alternative embodiments, one or more of such data processing tasks may be carried out by RF processor 226. In such alternative embodiments, one or more of transform function 300, inverse transform function 302, data combination function 304 and data compression function 306 are located in control processor 202 and/or RF processor 226.

In the embodiments depicted in FIG. 2, memory 204 is depicted as memory which is external to control processor 202. In alternative embodiments, memory 204 comprises memory which is internal to control processor 202.

In embodiments, the main data processing tasks of embodiments are carried out by a plurality of parallel control processors, for example one processor for processing the first received data and another processor for processing the second received data.

In embodiments described above, radio transceiver 110 comprises a cellular modem 120 adapted for wireless communication with a cellular network part 140 of telecommunications network 180 and data received via cellular radio modem 120 which is associated with wireless communication conducted via cellular radio modem 120 is processed and stored in a compressed form accordingly. In alternative embodiments, radio transceiver 110 comprises a non-cellular radio modem adapted for wireless communication with a non-cellular network part (not shown) of telecommunications network 180 and data received via the non-cellular radio modem which is associated with wireless communication conducted via the non-cellular radio modem is processed and stored in a compressed form accordingly. The non-cellular radio network part may for example comprise a WLAN IEEB802.11 (Wi-Fi™) or Bluetooth™ network comprising one or more wireless access points. Further alternative embodiments involve processing and storing a combination of data received from both cellular radio modem 120 and a non-cellular radio modem.

Benefits of employing embodiments have been described above in relation to an exemplary LTE case; embodiments may also be applied to W-CDMA Rel'99/HSDPA with similar benefits being achieved.

Various embodiments of UE 100 may include, but are not limited to: mobile (or 'cellular') telephones (including so-called "smart phones"), data cards, USB dongles, personal portable digital devices having wireless communication capabilities including but not limited to laptop/palmtop/tablet computers, digital cameras and music devices, sensor network components and Internet appliances. User equipment 100 may also be referred to as a user terminal or endpoint device.

Various embodiments of memories 204, 224 and 228 include any data storage technology type which is suitable to the local technical environment, including but not limited to semiconductor based memory devices, magnetic memory devices and systems, optical memory devices and systems, fixed memory, removable memory, disc memory, flash memory, DRAM, SRAM, EEPROM and the like. Various embodiments of processors 202, 222 and 226 include but are not limited to microprocessors, digital signal processors (DSPs), multi-core processors, general purpose computers, and special purpose computers.

It will be understood that any of processors 202, 222 and 226 or processing system or circuitry referred to herein may in practice be provided by a single chip or integrated circuit or plural chips or integrated circuits, optionally provided as a chipset, an application-specific integrated circuit (ASIC), field-programmable gate array (FPGA), etc. The chip or chips may comprise circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

Although at least some aspects of the embodiments described herein with reference to the drawings comprise computer processes performed in processing systems or processors, embodiments also extend to computer software, computer programs, particularly computer programs on or in a carrier, adapted for putting embodiments into practice. The program may be in the form of non-transitory source code, object code, a code intermediate source and object code such as in partially compiled form, or in any other non-transitory form suitable for use in the implementation of processes according to embodiments. The carrier may be any entity or device capable of carrying the program. For example, the carrier may comprise a storage medium, such as a solid-state drive (SSD) or other semiconductor-based RAM; a ROM, for example a CD ROM or a semiconductor ROM; a magnetic recording medium, for example a floppy disk or hard disk; optical memory devices in general; etc.

The term 'firmware' as used herein refers to one or more software programs or sets of instructions programmed on one or more hardware components or devices. Firmware provides the necessary instructions on how a device operates. Firmware can also be considered as semi-permanent, since it remains unchanged and untouched by the program execution itself, unless it is updated by a firmware update process. Firmware can also be considered as software for hardware, or software that is tightly coupled with hardware. The term 'baseband firmware' as used herein refers to firmware for baseband hardware.

In alternative embodiments, more than two sets of data are processed. Embodiments may comprise apparatus for use in processing data in a user equipment radio receiver, the radio receiver comprising a modem adapted for wireless communication with a telecommunications network, the apparatus comprising a processing system adapted to cause the apparatus to:

receive, via the modem, first data associated with wireless communication conducted via the modem, the first data being defined in a first domain;

transform the first data from the first domain into a second domain using a transform function to generate first transformed data in the second domain; compress the first transformed data in the second domain to produce first compressed data in the second domain; store, in memory in the radio receiver, the first compressed data; receive, via the modem, second data associated with wireless communication conducted via the modem, the second data being defined in the first domain; transform the second data from the first domain into the second domain using the transform function to generate second transformed data in the second domain; compress the second transformed data in the second domain to produce second compressed data in the second domain; combine, in the memory in the radio receiver, the first compressed data and the second compressed data in the second domain; receive, via the modem, third data associated with wireless communication conducted via the modem, the third data being defined in the first domain; transform the third data from the first domain into the second domain using the transform function to generate third transformed data in the second domain; compress the third transformed data in the second domain to produce third compressed data in the second domain; combine, in the memory in the radio receiver, the first compressed data, the second compressed data and the third compressed data in the second domain.

Embodiments may comprise apparatus for use in processing data in a user equipment radio receiver, the radio receiver comprising a modem adapted for wireless communication with a telecommunications network, the apparatus comprising a processing system adapted to cause the apparatus to: receive, via the modem, at least first and second data associated with wireless communication conducted via the modem, the at least first and second data being defined in a first domain; transform the at least first and second data from the first domain into a second domain using a transform function to generate at least first and second transformed data in the second domain; compress the at least first and second transformed data in the second domain to produce at least first and second compressed data in the second domain; combine the at least first and second compressed data in the second domain; and store, in memory in the radio receiver, the combined data.

In embodiments, baseband processor 222 and RF processor 226 share a common memory (not shown) instead of each having separate memories 224, 228 respectively.

In embodiments described above, UE 100 comprises a cellular radio modem 120 adapted for wireless communication with a cellular part 140 of telecommunication network 1. Embodiments could equally apply to a UE comprising a non-cellular radio modem adapted for wireless communication with a non-cellular part of telecommunication network 1. The non-cellular network part could comprise a WLAN IEEE802.11 (Wi-Fi™) or Bluetooth™ network and one or more wireless access points connected to a packet-switched network such as the Internet. In embodiments, the non-cellular radio modem comprises a baseband processor which, similarly to baseband processor 222 of cellular modem 120, carries out data processing tasks such as data compression and transformation.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of embodiments, which are defined in the accompanying claims.

LIST OF ACRONYMS AND ABBREVIATIONS

3GPP 3rd Generation Partnership Project
DCT discrete cosine transform
DFT discrete fourier transform
GSM global system for mobile communications
HARQ hybrid automatic repeat request
HSDPA high speed downlink packet access
HSPA high speed packet access
IEEE Institute of Electrical and Electronics Engineers
L1 layer 1, the physical layer in the OSI model
LTE long term evolution
LTE-A long term evolution advanced
OSI open systems interconnection
OTA over-the-air
PSTN public switched telephone network
Rel'99 3GPP Release 99
UE user equipment
W-CDMA wideband code division multiple access
WLAN wireless local area network

The invention claimed is:

1. An apparatus for use in processing data in a user equipment radio receiver, the radio receiver comprising a modem used for wireless communication with a telecommunications network, the apparatus comprising at least one processor, and at least one memory including computer program code, the at least one memory and the computer program code being configured to, with the at least one processor, cause the apparatus at least to: receive at the radio receiver, via the modem, first data associated with the wireless communication conducted via the modem, the first data being defined in a first domain and comprises Hybrid Automatic Repeat reQuest (HARQ) transmission data associated with the wireless communication conducted via the modem; transform the first data from the first domain into a second domain using a transform function to generate first transformed data in the second domain; compress the first transformed data in the second domain to produce first compressed data in the second domain; store, in memory in the radio receiver, the first compressed data; receive, via the modem, at least second data associated with the wireless communication conducted via the modem, the at least second data being defined in the first domain and being different than the first data; transform the at least second data from the first domain into the second domain using the transform function to generate at least second transformed data in the second domain; compress the at least second transformed data in the second domain to produce at least second compressed data in the second domain; and combine the at least second compressed data in the second domain with the first compressed data in the second domain stored in the memory of the radio receiver to thereby reduce an amount of data that needs to be stored in the memory of the radio receiver, wherein: the transform function is a linear transform function, the at least second data comprises HARQ re-transmission data associated with the wireless communication conducted via the modem, and the second compressed data in the second domain is combined with the first compressed data in the second domain using a HARQ combining operation.

2. The apparatus according to claim 1, wherein the combination and storing of combined, compressed data is carried out in place in the at least one memory in the radio receiver.

3. The apparatus according to claim 2, wherein the at least one memory and the computer program code are further configured to, with the at least one processor, cause the apparatus at least to:
retrieve the combined, compressed data from the at least one memory in the radio receiver;
decompress the combined, compressed data retrieved from the at least one memory in the radio receiver; and
transform the decompressed, combined data from the second domain into the first domain using an inverse of the transform function to produce combined data in the first domain.

4. The apparatus according to claim 1, wherein the at least one memory and the computer program code are further configured to, with the at least one processor, cause the apparatus at least to:
retrieve the first compressed data from the at least one memory in the radio receiver;
decompress the first compressed data retrieved from the at least one memory in the radio receiver, and
transform the decompressed data from the second domain into the first domain using an inverse of the transform function to produce data in the first domain.

5. The apparatus according to claim 1, wherein: the first data comprises data relating to a first radio channel estimate, the at least second data comprises data relating to a second radio channel estimate associated with the wireless communication conducted via the modem, and the combining comprises averaging of the first radio channel estimate data and the second radio channel estimate data over at least one of time and frequency.

6. The apparatus according to claim 1, wherein the compression comprises a lossy compression.

7. The apparatus according to claim 6, wherein the lossy compression comprises at least one of quantizing and scaling.

8. The apparatus according to claim 1, wherein the transform function comprises one or more of a linear transform function, a Discrete Fourier Transform (DFT), a Discrete Cosine Transform (DCT), and a Walsh Hadamard Transform (WHT).

9. A method of processing data in a user equipment radio receiver, the radio receiver comprising a modem used for wireless communication with a telecommunications network, the method comprising: receiving at the radio receiver, via the modem, first data associated with the wireless communication conducted via the modem, the first data being defined in a first domain and comprises Hybrid Automatic Repeat reQuest (HARQ) transmission data associated with the wireless communication conducted via the modem; transforming the first data from the first domain into a second domain using a transform function to generate first transformed data in the second domain; compressing the first transformed data in the second domain to produce first compressed data in the second domain; storing, in memory in the radio receiver, the first compressed data; receiving, via the modem, at least second data associated with the wireless communication conducted via the modem, the at least second data being defined in the first domain and being different than the first data; transforming the at least second data from the first domain into the second domain using the transform function to generate at least second transformed data in the second domain; compressing the at least second transformed data in the second domain to produce at least second compressed data in the second domain; and combining the at least second compressed data in the second domain with the first compressed data in the second domain stored in the memory of the radio receiver to thereby reduce an amount of data that needs to be stored in the memory of the radio receiver, wherein: the transform function is a linear transform function, the at least second data comprises HARQ re-transmission data associated with the wireless communication conducted via the modem and the combining comprises a HARQ combining operation.

10. The method according to claim 9, wherein the combination and storing of combined, compressed data is carried out in place in the memory in the radio receiver.

11. The method according to claim 10, further comprising:
retrieving the combined, compressed data from the memory in the radio receiver;
decompressing the combined, compressed data retrieved from the memory in the radio receiver; and
transforming the decompressed, combined data from the second domain into the first domain using an inverse of the transform function to produce combined data in the first domain.

12. The method according to claim 9, further comprising:
retrieving the first compressed data from the memory in the radio receiver;
decompressing the first compressed data retrieved from the memory in the radio receiver; and
transforming the decompressed data from the second domain into the first domain using an inverse of the transform function to produce data in the first domain.

13. The method according to claim 9, wherein: the first data comprises data relating to a first radio channel estimate, the at least second data comprises data relating to a second radio channel estimate associated with wireless communication conducted via the modem, and the combining comprises averaging of the first radio channel estimate data and the second radio channel estimate data over at least one of time and frequency.

14. The method according to claim 9, wherein the compression comprises a lossy compression.

15. A computer program product comprising a non-transitory computer-readable storage medium having computer readable instructions stored thereon, the computer readable instructions being executable by a computerized device to cause the computerized device to perform a method of processing data in a user equipment radio receiver comprising a modem, the method comprising: receiving at the radio receiver, via the modem, first data associated with the wireless communication conducted via the modem, the first data being defined in a first domain and comprises Hybrid Automatic Repeat reQuest (HARQ) transmission data associated with the wireless communication conducted via the modem; transforming the first data from the first domain into a second domain using a transform function to generate first transformed data in the second domain; compressing the first transformed data in the second domain to produce first compressed data in the second domain; storing, in memory in the radio receiver, the first compressed data; receiving, via the modem, at least second data associated with the wireless communication conducted via the modem, the at least second data being defined in the first domain and being different than the first data; transforming the at least second data from the first domain into the second domain using the transform function to generate at least second transformed data in the second domain; compressing the at least second transformed data in the second domain to produce at least second compressed data in the second domain; and combining the at least second compressed data in the second domain with the first compressed data in the second domain stored in the memory of radio receiver to thereby reduce an amount of data that needs to be stored in the memory of the radio receiver, wherein: the transform function is a linear transform function, the at least second data comprises HARQ re-transmission data associated with the wireless communication conducted via the modem, and the combining comprises a HARQ combining operation.

16. The computer program product according to claim 15, wherein the method implements one or more of a chipset, a radio receiver and a user equipment.

17. The computer program product according to claim 15, wherein the combination and storing of combined, compressed data is carried out in place in the memory in the radio receiver.

18. The computer program product according to claim 17, the computer readable instructions being executable by the computerized device to cause the computerized device to perform a method of processing data in a user equipment radio receiver further including the steps of:
retrieving the combined, compressed data from the memory in the radio receiver;
decompressing the combined, compressed data retrieved from the memory in the radio receiver; and
transforming the decompressed, combined data from the second domain into the first domain using an inverse of the transform function to produce combined data in the first domain.

19. The computer program product according to claim 15, the computer readable instructions being executable by the computerized device to cause the computerized device to perform a method of processing data in a user equipment radio receiver further including the steps of:
retrieving the first compressed data from the memory in the radio receiver;
decompressing the first compressed data retrieved from the memory in the radio receiver; and
transforming the decompressed data from the second domain into the first domain using an inverse of the transform function to produce data in the first domain.

20. The computer program product according to claim 15, wherein: the first data comprises data relating to a first radio channel estimate, the at least second data comprises data relating to a second radio channel estimate associated with wireless communication conducted via the modem, and the combining comprises averaging of the first radio channel estimate data and the second radio channel estimate data over at least one of time and frequency.

21. An apparatus for use in processing data in a user equipment radio receiver, the radio receiver comprising a modem used for wireless communication with a telecommunications network, the apparatus comprising a processing system used to cause the apparatus to: receive at the radio receiver, via the modem, first data associated with the wireless communication conducted via the modem, the first data being defined in a first domain and comprising data relating to a first radio channel estimate associated with the wireless communication conducted via the modem; transform the first data from the first domain into a second domain using a transform function to generate first transformed data in the second domain; compress the first transformed data in the second domain to produce first compressed data in the second domain; store, in memory in the radio receiver, the first compressed data; receive, via the modem, at least second data associated with the wireless communication conducted via the modem, the at least second data being defined in the first domain and comprising data relating to a second radio channel estimate associated with wireless communication conducted via the modem; transform the at least second data from the first domain into the second domain using the transform function to generate at least second transformed data in the second domain; compress the at least second transformed data in the second domain to produce at least second compressed data in the second domain; and combine the at least second compressed data in the second domain with the first compressed data in the second domain stored in the memory of the radio receiver to thereby average the first radio channel estimate data and the second radio channel estimate data over at least one of time and frequency when compressed and to reduce an amount of data that needs to be stored in the memory of the radio receiver, wherein the transform function is a linear transform function and wherein a lossy compression is used to compress the first transformed data.

22. The apparatus according to claim 21, wherein the combination and storing of combined, compressed data is carried out in place in the memory in the radio receiver.

23. The apparatus according to claim 22, the processing system being further used to: retrieve the combined, compressed data from the memory in the radio receiver; decompress the combined, compressed data retrieved from the memory in the radio receiver; and transform the decompressed, combined data from the second domain into the first domain using an inverse of the transform function to produce combined data in the first domain.

24. The apparatus according to claim 21, the processing system being further used to: retrieve the combined, compressed data from the memory in the radio receiver; decompress the combined, compressed data retrieved from the memory in the radio receiver; and transform the decompressed data from the second domain into the first domain using an inverse of the transform function to produce data in the first domain.

25. The apparatus according to claim 21, wherein the lossy compression comprises at least one of quantizing and scaling.

26. The apparatus according to claim 21, wherein the transform function comprises at least one of a linear transform function, a Discrete Fourier Transform (DFT), a Discrete Cosine Transform (DCT) and a Walsh Hadamard Transform (WHT).

27. The apparatus according to claim 21, wherein the apparatus comprises one of a chipset, a radio receiver, and a user equipment.

28. A method of processing data in a user equipment radio receiver, the receiver comprising a modem used for wireless communication with a telecommunications network, the method comprising: receiving at the radio receiver; via the modem, first data associated with the wireless communication conducted via the modem, the first data being defined in a first domain and comprising data relating to a first radio channel estimate associated with the wireless communication conducted via the modem; transforming the first data from the first domain into a second domain using a transform function to generate first transformed data in the second domain; compressing the first transformed data in the second domain to produce first compressed data in the second domain; storing, in memory in the radio receiver, the first compressed data; receiving, via the modem, at least second data associated with the wireless communication conducted via the modem, the at least second data being defined in the first domain and comprising data relating to a second radio channel estimate associated with wireless communication conducted via the modem; transforming the at least second data from the first domain into the second domain using the transform function to generate at least second transformed data in the second domain; compressing the at least second transformed data in the second domain to produce at least second compressed data in the second domain; and combining the at least second compressed data in the second domain with the first compressed data in the second domain stored in the memory of the radio receiver to thereby average the data relating to the first radio channel estimate and the data relating to the second radio channel estimate over at least one of time and frequency when compressed and to reduce an amount of data that needs to be stored in the memory of the radio receiver, wherein the transform function is a linear transform function and wherein the compressing comprises a lossy compression.

29. The method according to claim 28, wherein the combination and storing of combined, compressed data is carried out in place in the memory in the radio receiver.

30. The method according to claim 29, further comprising:
retrieving the combined, compressed data from the memory in the radio receiver;
decompressing the combined, compressed data retrieved from the memory in the radio receiver; and
transforming the decompressed, combined data from the second domain into the first domain using an inverse of the transform function to produce combined data in the first domain.

31. The method according to claim 28, further comprising retrieving the combined, compressed data from the memory in the radio receiver;
decompressing the combined, compressed data retrieved from the memory in the radio receiver; and
transforming the decompressed data from the second domain into the first domain using an inverse of the transform function to produce data in the first domain.

32. The method according to claim 28, wherein the lossy compression comprises at least one of quantizing, discarding and scaling.

33. The method according to claim 28, wherein the transform function comprises at least one of a linear transform function, a Discrete Fourier Transform (DFT), a Discrete Cosine Transform (DCT) and a Walsh Hadamard Transform (WHT).

34. A computer program product comprising a non-transitory computer readable storage medium having computer readable instructions stored thereon, the computer readable instructions being executable by a computerized device for use in processing data in a user equipment radio receiver comprising a modem used for wireless communication with a telecommunications network, to cause the computerized device to: receive at the radio receiver, via the modem, first data associated with wireless communication conducted via the modem, the first data being defined in a first domain and comprising data relating to a first radio channel estimate associated with the wireless communication conducted via the modem; transform the first data from the first domain into a second domain using a transform function to generate first transformed data in the second domain; compress the first transformed data in the second domain to produce first compressed data in the second domain; store, in memory in the radio receiver, the first compressed data; receive, via the modem, at least second data associated with the wireless communication conducted via the modem, the at least second data being defined in the first domain and comprising data relating to a second radio channel estimate associated with the wireless communication conducted via the modem; transform the at least second data from the first domain into the second domain using the transform function to generate at least second transformed data in the second domain; compress the at least second transformed data in the second domain to produce at least second compressed data in the second domain; and combine at least second compressed data in the second domain with the first compressed data in the second domain stored in the memory of the radio receiver to thereby average the data related to the first radio channel estimate and the data related to the second radio channel estimate over at least one of time and frequency when compressed and to reduce an amount of data that needs to be stored in the memory of the radio receiver, wherein the transform function is a linear transform function and wherein a lossy compression is used to compress the second transformed data.

35. The computer program product according to claim 34, wherein the combination and storing of combined, compressed data is carried out in place in the memory in the radio receiver.

36. The computer program product according to claim 35, being further used to cause the computerized device to: retrieve the combined, compressed data from the memory in the radio receiver; decompress the combined, compressed data retrieved from the memory in the radio receiver; and transform the decompressed, combined data from the second domain into the first domain using an inverse of the transform function to produce combined data in the first domain.

37. The computer program product according to claim 34, being further used to cause the computerized device to: retrieve the combined, compressed data from the memory in the radio receiver; decompress the combined, compressed data retrieved from the memory in the radio receiver; and transform the decompressed data from the second domain into the first domain using an inverse of the transform function to produce data in the first domain.

38. The computer program product according to claim 34, wherein the lossy compression comprises at least one of quantizing and scaling.

39. The computer program product according to claim 34, wherein the transform function comprises at least one of a linear transform function, a Discrete Fourier Transform (DFT), a Discrete Cosine Transform (DCT), and a Walsh Hadamard Transform (WHT).

* * * * *